US010332603B2

(12) United States Patent
Louie et al.

(10) Patent No.: US 10,332,603 B2
(45) Date of Patent: Jun. 25, 2019

(54) ACCESS LINE MANAGEMENT IN A MEMORY DEVICE

(71) Applicant: MICRON TECHNOLOGY, INC., Boise, ID (US)

(72) Inventors: Benjamin Louie, Fremont, CA (US); Ali Mohammadzadeh, San Jose, CA (US); Aaron S. Yip, Los Gatos, CA (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 15/869,501

(22) Filed: Jan. 12, 2018

(65) Prior Publication Data

US 2018/0137921 A1 May 17, 2018

Related U.S. Application Data

(60) Continuation of application No. 15/342,255, filed on Nov. 3, 2016, now Pat. No. 9,875,802, which is a division of application No. 14/958,217, filed on Dec. 3, 2015, now Pat. No. 9,514,829, which is a division of application No. 14/153,590, filed on Jan. 13, 2014, now Pat. No. 9,218,884, which is a division of application No. 12/888,765, filed on Sep. 23, 2010, now Pat. No. 8,638,632.

(51) Int. Cl.
| *G11C 16/24* | (2006.01) |
| *G11C 16/04* | (2006.01) |
| *G11C 16/06* | (2006.01) |
| *G11C 16/08* | (2006.01) |
| *G11C 16/10* | (2006.01) |
| *G11C 16/14* | (2006.01) |
| *G11C 16/26* | (2006.01) |

(52) U.S. Cl.
CPC .......... *G11C 16/24* (2013.01); *G11C 16/0483* (2013.01); *G11C 16/06* (2013.01); *G11C 16/08* (2013.01); *G11C 16/10* (2013.01); *G11C 16/14* (2013.01); *G11C 16/26* (2013.01)

(58) Field of Classification Search
CPC ..... G11C 16/24; G11C 16/0483; G11C 16/06; G11C 16/10; G11C 16/14
USPC ......................................... 365/226, 227, 228
See application file for complete search history.

(56) References Cited

U.S. PATENT DOCUMENTS 5,715,194 A 2/1998 Hu
5,796,657 A 8/1998 Lee et al.
(Continued)

Primary Examiner — Han Yang
(74) Attorney, Agent, or Firm — Dicke, Billig & Czaja, PLLC

(57) ABSTRACT

Memory devices including an array of memory cells, a plurality of access lines selectively coupled to respective pluralities of memory cells of the array of memory cells, a plurality of first registers, a second register, a first multiplexer, a second multiplexer, and a decoder configured to selectively connect a corresponding access line to a selected voltage source of a plurality of voltage sources in response to the output of the second multiplexer, wherein the second multiplexer is configured to pass a selected one of the output of the second register and the output of the first multiplexer to its output, and wherein the first multiplexer is configured to pass a selected one of the outputs of the plurality of first registers to its output.

20 Claims, 4 Drawing Sheets

(56) References Cited

U.S. PATENT DOCUMENTS

| | | |
|---|---|---|
| 6,807,102 B2 | 10/2004 | Imamiya et al. |
| 7,269,068 B2 | 9/2007 | Chae et al. |
| 7,315,158 B1 | 1/2008 | Matsui |
| 7,327,614 B2 | 2/2008 | Kang |
| 7,392,413 B2 | 6/2008 | Shikata |
| 7,864,586 B2 | 1/2011 | Tokiwa |
| 8,305,804 B2 | 11/2012 | Kim et al. |
| 2003/0035335 A1 | 2/2003 | Kawaguchi et al. |
| 2006/0171208 A1* | 8/2006 | Chu .................. G06F 9/30098 365/189.02 |
| 2007/0115713 A1 | 5/2007 | Trossen |
| 2007/0147165 A1 | 6/2007 | Kato |
| 2010/0097858 A1 | 4/2010 | Tokiwa et al. |

* cited by examiner

ACCESS LINE MANAGEMENT IN A MEMORY DEVICE

RELATED APPLICATIONS

This application is a continuation of application Ser. No. 15/342,255, filed Nov. 3, 2016 (allowed), which is a divisional of application Ser. No. 14/958,217, filed Dec. 3, 2015 and issued as U.S. Pat. No. 9,514,829 on Dec. 6, 2016, which is a divisional of application Ser. No. 14/153,590, filed Jan. 13, 2014 and issued as U.S. Pat. No. 9,218,884 on Dec. 22, 2015, which is a divisional of application Ser. No. 12/888,765, filed Sep. 23, 2010 and issued as U.S. Pat. No. 8,638,632 on Jan. 28, 2014, all of which are commonly assigned and incorporated in their entirety herein by reference.

TECHNICAL FIELD

The present disclosure relates generally to semiconductor memory and more particularly, in one or more embodiments, to access line management in non-volatile memory devices.

BACKGROUND

Flash memory devices have developed into a popular source of non-volatile memory for a wide range of electronic applications. Flash memory devices typically use a one-transistor memory cell that allows for high memory densities, high reliability, and low power consumption. Changes in threshold voltage of the cells, through programming (which is sometimes referred to as writing) of charge storage structures (e.g., floating gates or charge traps) or other physical phenomena (e.g., phase change or polarization), determine the data value of each cell. Common uses for flash memory include personal computers, personal digital assistants (PDAs), digital cameras, digital media players, cellular telephones, and removable memory modules, and the uses for flash memory continue to expand.

Flash memory typically utilizes one of two basic architectures known as NOR Flash and NAND Flash. The designation is derived from the logic used to read the devices. FIG. 1 illustrates a NAND type flash memory array architecture 100 wherein the floating gate memory cells 102 of the memory array are logically arranged in an array of rows and columns. In a conventional NAND Flash architecture, "rows" refers to memory cells having commonly coupled control gates, while "columns" refers to memory cells coupled as one or more NAND strings of memory cells 102, for example. The memory cells 102 of the array are arranged together in strings (e.g., NAND strings), typically of 8, 16, 32, or more each. Memory cells of a string are connected together in series, source to drain, between a source line 114 and a data line 116, often referred to as a bit line. Each series string of memory cells is coupled to source line 114 by a source select gate such as select gates 110 and to an individual bit line 116 by drain select gates 104, for example. The source select gates 110 are controlled by a source select gate (SGS) control line 112 coupled to their control gates. The drain select gates 104 are controlled by a drain select gate (SGD) control line 106. The one or more strings of memory cells are also typically arranged in groups (e.g., blocks) of memory cells.

The memory array is accessed by a string driver (not shown) configured to activate a logical row of memory cells by selecting a particular access line 118, often referred to as a word line, such as WL7-WL0 $118_{7-0}$, for example. Each word line 118 is coupled to the control gates of a row of memory cells 120. Bit lines BL1-BL4 $116_1$-$116_4$ can be driven high or low depending on the type of operation being performed on the array. As is known to those skilled in the art, the number of word lines and bit lines might be much greater than those shown in FIG. 1.

Memory cells 102 can be configured as what are known in the art as Single Level Memory Cells (SLC) or Multilevel Memory Cells (MLC). SLC and MLC memory cells assign a data state (e.g., as represented by one or more bits) to a specific range of threshold voltages (Vt) stored on the memory cells. Single level memory cells (SLC) permit the storage of a single binary digit (e.g., bit) of data on each memory cell. Meanwhile, MLC technology permits the storage of two or more binary digits per cell (e.g., 2, 4, 8, 16 bits), depending on the quantity of Vt ranges assigned to the cell and the stability of the assigned Vt ranges during the lifetime operation of the memory cell. By way of example, one bit (e.g., 1 or 0) may be represented by two Vt ranges, two bits by four ranges, three bits by eight ranges, etc.

Programming typically involves applying one or more programming pulses (VPGM) to a selected word line, such as $118_4$, and thus to the control gate of each memory cell 120 coupled to the selected word line. Typical programming pulses (VPGM) start at or near 15V and tend to increase in magnitude during each programming pulse application. While the program voltage (e.g., programming pulse) is applied to the selected word line, a potential, such as a ground potential, is applied to the substrate, and thus to the channels of these memory cells, resulting in a charge transfer from the channel to the floating gates of memory cells targeted for programming. More specifically, the floating gates are typically charged through direct injection or Fowler-Nordheim tunneling of electrons from the channel to the floating gate, resulting in a Vt typically greater than zero in a programmed state, for example. In the example of FIG. 1, a VPASS voltage is applied to each unselected word line $118_7$-$118_5$,$118_3$-$118_0$. VPASS might be 10V, for example. The VPASS applied to each unselected word line might be different voltages. For example, a word line adjacent to the selected word line might be biased to a VPASS potential of 8V. The next adjacent word line might be biased to 7V and the next adjacent word line might be biased to 0V, for example. The VPASS voltages are not high enough to cause programming of memory cells biased with a VPASS voltage.

An inhibit voltage is typically applied to bit lines (e.g., Vcc) not coupled to a NAND string containing a memory cell that is targeted for programming. During a programming operation alternate bit lines are enabled and inhibited from programming. For example, even numbered bit lines might be enabled for programming memory cells coupled to even numbered bit lines while the odd numbered bit lines are inhibited from programming memory cells coupled to the odd numbered bit lines. A subsequent programming operation then inhibits the even numbered bit lines and enables the odd numbered bit lines. For example, memory cells $120_1$ and $120_3$ are selected for programming and memory cells $120_2$ and $120_4$ are inhibited from programming as shown in FIG. 1. During a typical programming operation, the word lines adjacent to the selected word line are biased to one of a number of voltages (e.g., VPASS).

Between the application of one or more programming (e.g., VPGM) pulses, a verify operation is performed to check each selected memory cell to determine if it has reached its intended programmed state. If a selected memory cell has reached its intended programmed state it is inhibited from further programming if there remain other memory cells of the selected row still requiring additional programming pulses to reach their intended programmed states. Following a verify operation, an additional programming pulse VPGM is applied if there are memory cells that have not completed programming. This process of applying a programming pulse followed by performing a verify operation continues until all the selected memory cells have reached their intended programmed states. If a particular number of programming pulses (e.g., maximum number) have been applied and one or more selected memory cells still have not completed programming, those memory cells might be marked as defective, for example.

Bit lines BL1-BL4 116 are coupled to sensing devices (e.g., sense amplifiers) 130 that detect the state of each cell by sensing voltage or current on a particular bit line 116. The word lines WL7-WL0 118 select the individual memory cells 102 in the series strings to be written to or read from and operate the remaining memory cells in each series string in a pass through mode.

During the development phase of memory devices, it is unknown what a preferred pattern of VPASS voltages to be applied for a given selected word line $118_4$ will be. Thus, a prototype device may be constructed utilizing an estimated pattern of VPASS voltages to be applied during programming operations of the memory device, for example. These patterns are "hard-wired" into a metal mask of the device. Thus, if the estimated pattern needs to be changed, a new device having a new metal mask is required. Having to wait for a new prototype to be manufactured can be costly in both time and money.

For the reasons stated above, and for other reasons which will become apparent to those skilled in the art upon reading and understanding the present specification, there is a need in the art, for example, for methods and apparatus to facilitate efficient testing of various memory device operations without requiring hardware changes.

DETAILED DESCRIPTION

In the following detailed description of the invention, reference is made to the accompanying drawings that form a part hereof, and in which is shown by way of illustration specific embodiments in which the embodiments may be practiced. These embodiments are described in sufficient detail to enable those skilled in the art to practice the invention, and it is to be understood that other embodiments may be utilized and that process, electrical or mechanical changes may be made without departing from the scope of the present disclosure. The following detailed description is, therefore, not to be taken in a limiting sense.

Figure 2:
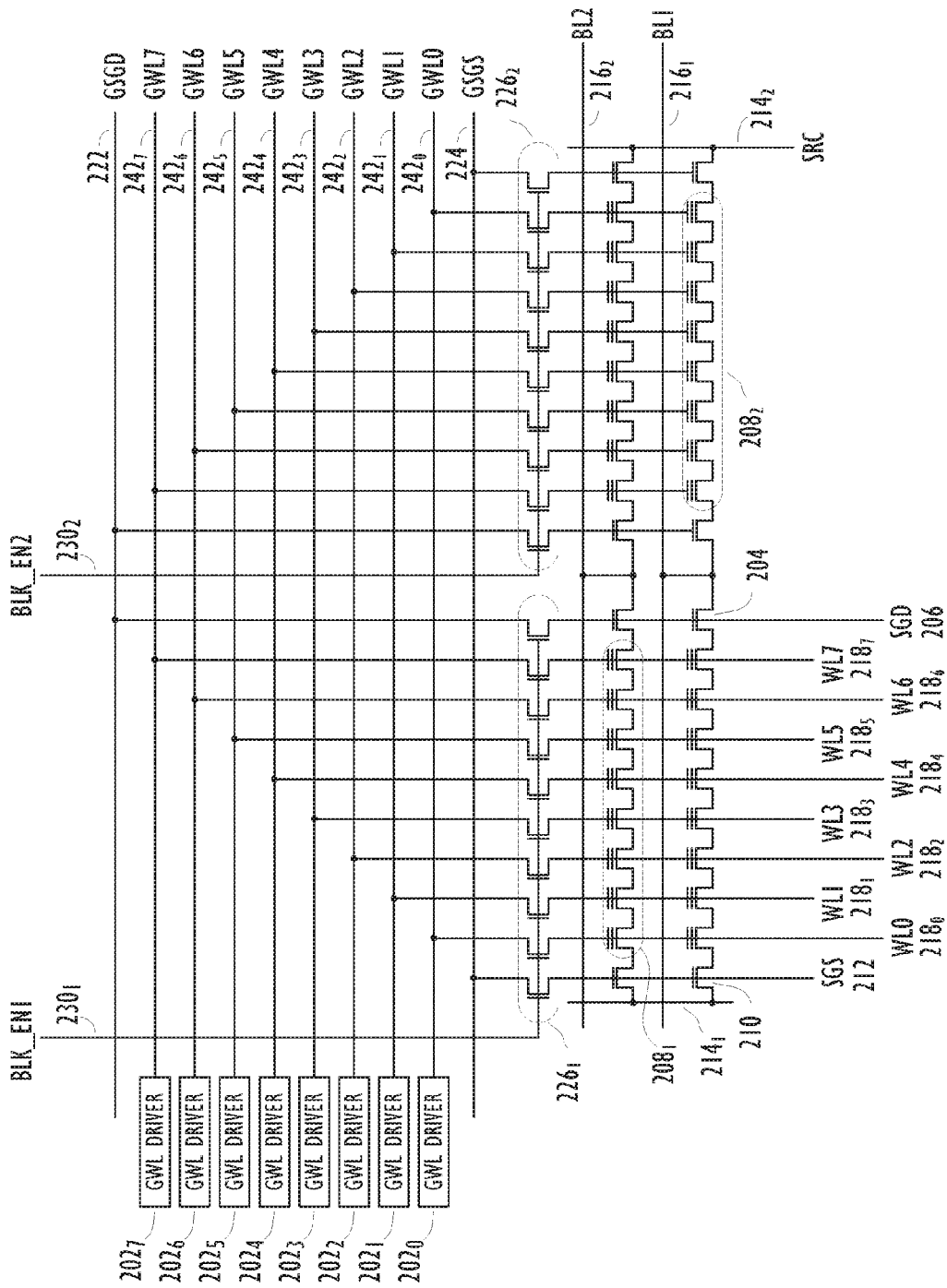
FIG. 2 shows an arrangement of a plurality of blocks of memory cells of a memory array organized in a NAND architecture according to an embodiment of the present disclosure.

FIG. 2 illustrates a schematic representation of a plurality of NAND strings of memory cells 208 coupled to local word lines 218. Global control signals GSGS/GSGD 224, 222 and local control signals SGS/SGD 212, 206 are also illustrated. The global signals are coupled to their respective local signals by string drivers 226. String drivers 226 are controlled by the block enable signals BLK_EN1 $230_1$ and BLK_EN2 $230_2$. Typically, when one block enable signal is active, such as BLK_EN1 $230_1$, the adjacent block enable signal $230_2$ is not active so as to deactivate the string drivers $226_2$ coupled to it. This prevents having multiple NAND strings coupled to a common bit line from being active at the same time, for example. Signals GSGD 222, GWL7-GWL0 242 and GSGS 224 are referred to as global signals in that these signals are coupled to multiple blocks of memory cells. For example, NAND string $208_1$ might be part of a first block of memory and NAND string $208_2$ might be part of a second block of memory. Signals SGS 212, WL7-WL0 218 and SGD 206 are referred to as local signals in that these signals are coupled to a single block of memory cells, for example. Thus, the local signals are coupled to the global signals by the string drivers 226.

Figure 1:
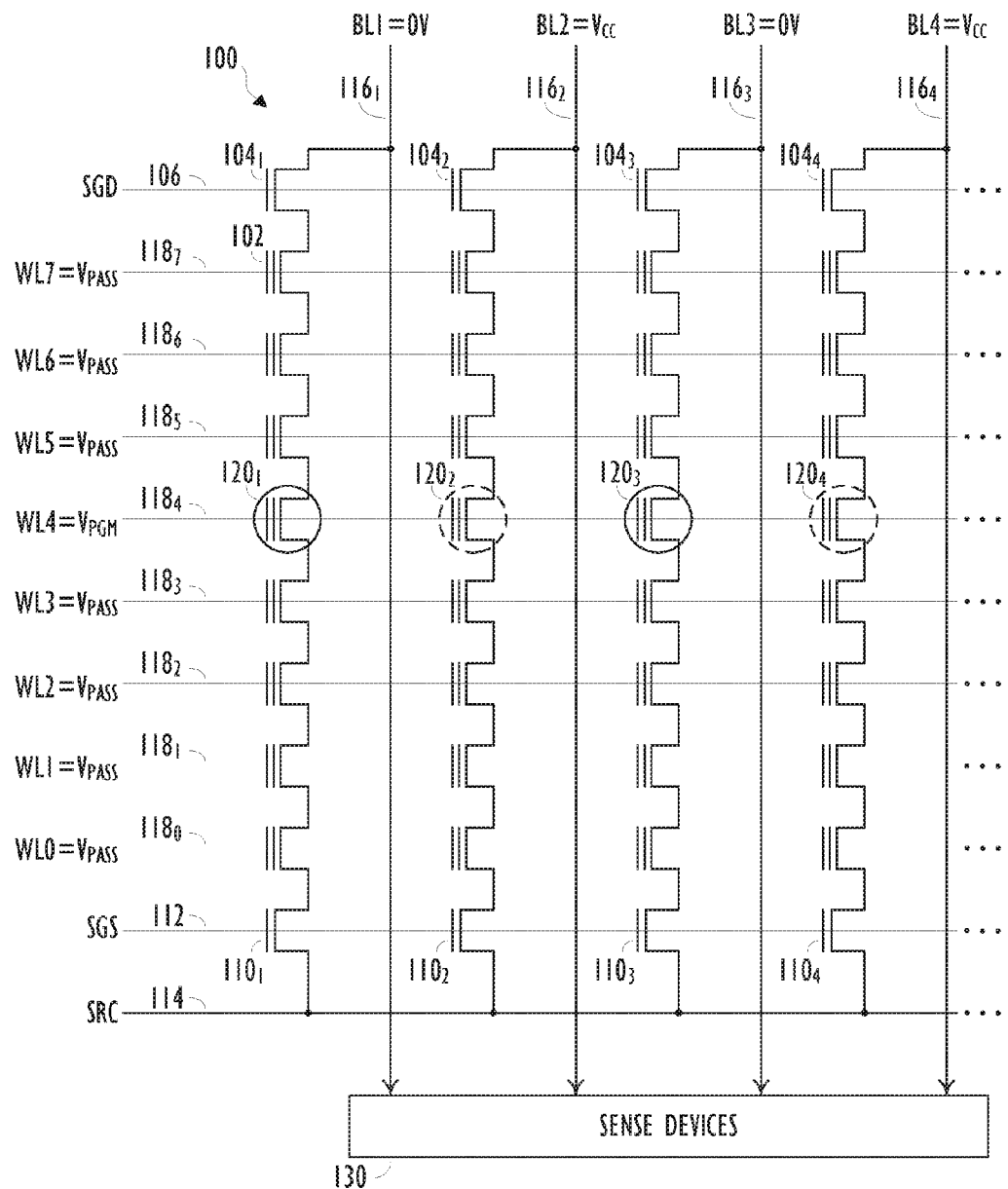
FIG. 1 shows a typical arrangement of multiple series strings of memory cells of a memory array organized in a NAND architecture.

Each NAND string of memory cells 208 shown in FIG. 2 is coupled at a first end to a bit line 216 by a drain select gate 204 and is further coupled at the second end of the string to a source line 214 by a source select gate 210 such as discussed above with respect to FIG. 1. Each global word line 242 shown in FIG. 2 is driven by a global word line driver circuit 202, where each driver is configured to bias (e.g., drive) the coupled global word line to a particular voltage (e.g., a VPASS voltage), according to various embodiments of the present disclosure. For example, a particular global word line 242 (e.g., a selected global word line) might be biased with a programming pulse during a programming operation performed on a row of memory cells coupled to the particular global word line. The particular global word line might also be biased with a particular VPASS or read voltage, dependent on the memory device operation being performed, for example.

Figure 3:
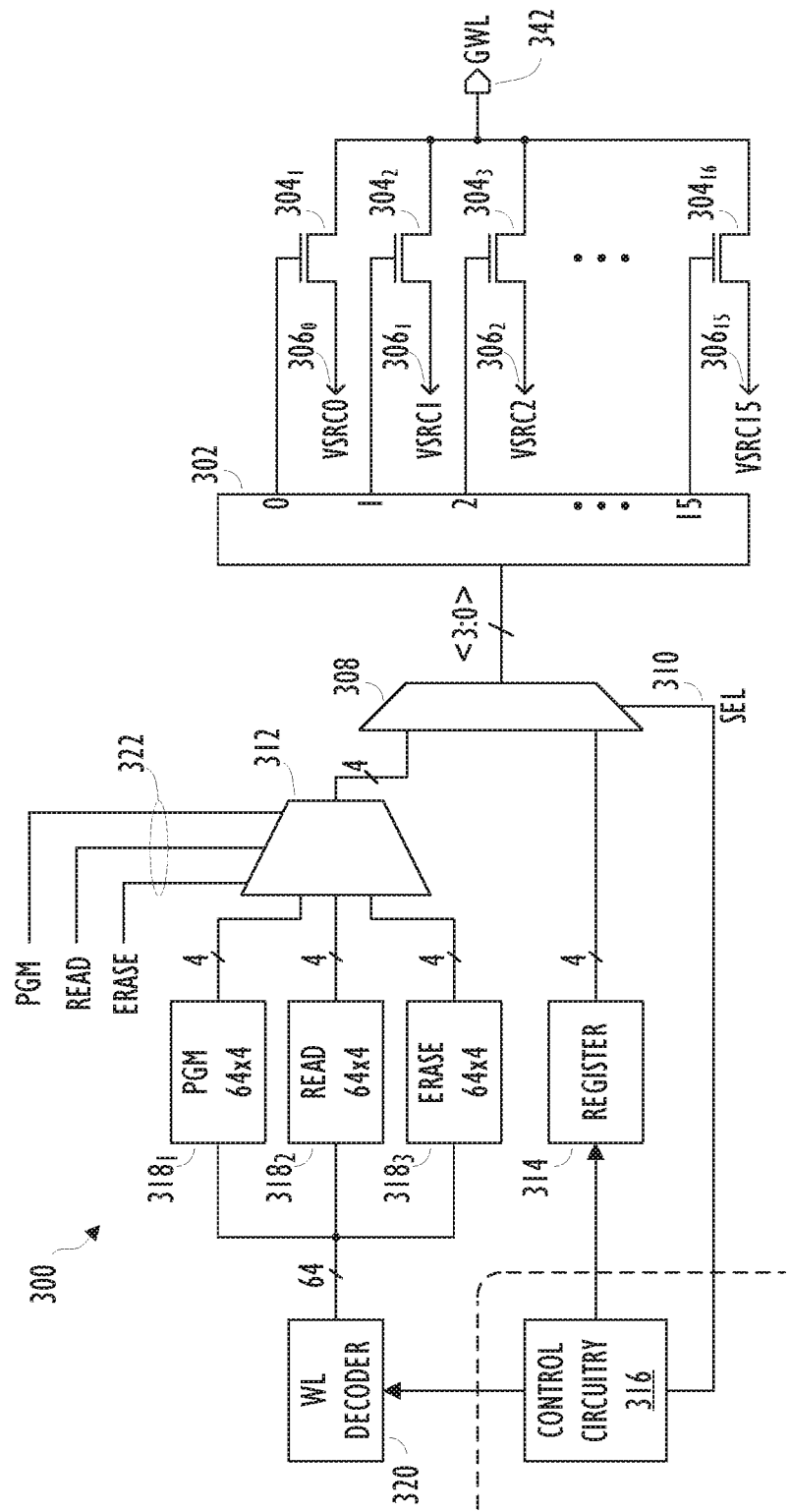
FIG. 3 shows a schematic diagram of a word line driver according to an embodiment of the present disclosure.

FIG. 3 illustrates a word line (e.g., global word line) driver circuit 300 configured to drive a global word line, such as one of the global word lines 242 shown in FIG. 2. Thus, each global word line 242 of FIG. 2 might be driven by a driver circuit 300 of FIG. 3 according to various embodiments of the present disclosure, for example. The output node 342 of driver circuit 300 is coupled to a global word line of the plurality of global word lines 242.

FIG. 3 illustrates a decoder 302 coupled to the control gates of a plurality of transistors 304. Each of these transistors 304 is coupled to a separate voltage source 306 and to the word line driver output node 342. Thus, a particular output of decoder 302 biases a particular gate of a particular transistor 304 to bias the word line driver output node 342 with a particular voltage source 306. FIG. 3 illustrates sixteen voltage sources VSRC0-VSRC15 $306_0$-$306_{15}$. However, various embodiments according to the present disclosure are not so limited as there might be a different number of voltages sources that the word line driver output node 342 might be coupled to through transistors $304_{1-16}$. The voltages supplied by the voltage sources 306 might have various ranges of voltages. For example, VSRC0 might supply a bias of 0V and VSRC15 might supply a voltage of 10V, with VSRC1-VSRC14 each providing an incrementally increasing voltage between 0V and 10V, for example. According to one or more embodiments, the minimum voltage supplied by the voltage sources 306 might be greater than 0V. Additional embodiments according to the present disclosure might comprise voltage sources 306 having equal step increases in voltage between each voltage source, wherein further embodiments might comprise voltage sources having non-equal step increases between voltage sources.

The word line driver circuit 300 further comprises a number of multiplexer circuits to provide a signal for the decoder 302 to decode. For example, the output of multiplexer 308 provides input signals for the decoder 302. The number of outputs of multiplexer 308 coupled to decoder 302 might be comprised of four signal (e.g., <3:0>) lines. Additional embodiments might comprise a different number of signal lines coupling the multiplexer 308 and the decoder 302. The four signal lines coupling the multiplexer 308 and the decoder 302 facilitate configuring the driver circuit 300 to enable one of the sixteen decoder outputs (e.g., 0-15) to drive the transistors 304 responsive to signals provided by multiplexer 308.

Multiplexer 308 depicted in FIG. 3 comprises two groups of four input signal lines each. For example, one group of four signal lines is provided by multiplexer 312 and the second group of four signal lines is provided by the register 314. The SEL signal line 310 coupled to the multiplexer 308 provides a signal to select which group of signals will pass through the multiplexer 308 and on to the decoder 302. For example, a logic level high (e.g., logic 1) on the SEL signal 310 might select the signals provided by the multiplexer 312 to pass through the multiplexer 308. A logic level low (e.g., logic 0) on the SEL signal 310 might select the signals provided from the register 314 to pass through the multiplexer 308.

Control circuitry, such as control circuitry 316, might be configured to bias the SEL signal line 310 to control the multiplexer 308, for example. Each global word line driver 300 might comprise control circuitry in each global word line driver circuit 300. According to additional embodiments, the control circuitry 316 might be external (e.g., as indicated by the dashed line in FIG. 3) to each individual global word line driver circuit 300. The control circuitry 316 might then be commonly coupled to provide each global word line driver 300 of the memory device with the control signals for each driver circuit, such as the SEL signals 310, for example.

Register 314 illustrated in FIG. 3 might be configured to be loaded with word line bias information (e.g., a voltage source selection) that can be loaded by a user, such as a test engineer, for example. For example, if word line WL1 is selected for a programming operation, then the word lines other than word line WL1 (e.g., word lines WL0 and WL2-WL7) might be biased according to a bias pattern associated with word line WL1. The user might send bias information corresponding to one or more word line bias patterns to the register 314, such as through a host (not shown) coupled to the memory device. A number of memory device operations can be performed on the memory device and the performance of the device can be characterized. For example, a number of programming operations might be performed on the memory device utilizing a particular word line bias pattern. The user might then load a different selection (belonging to a different bias pattern) into the register 314. Additional programming operations can then be performed on the memory device to further characterize the performance of the device. This process can be repeated as many times as desired by the test engineer to generate a overall operating characteristic of the memory device under one or more different word line biasing scenarios.

Table 1 illustrates an example word line bias pattern according to one or more embodiments of the present disclosure. Table 1 includes only four word lines to reduce the size and improve readability of the table. Various embodiments according to the present disclosure might comprise many more word lines (e.g., 8, 16, 32, 64, etc.) than are referenced in Table 1. The left column of Table 1 indicates a particular word line of a memory device selected for a memory device operation, such as a programming operation, for example. Thus, the WL Bias Pattern associated with the selected word line contains information on how the word lines might be biased during the memory device operation. The voltage values shown in Table 1 are for illustrative purpose only and are not fixed according to various embodiments of the present disclosure. These values are adjustable, such as by a test engineer discussed above, for example. According to one or more embodiments, a selection of one of these voltages might be stored in the register 314 in the form of binary digits (e.g., bits.) The voltage selection might be stored as a four bit value which is decoded by the decoder 302 in order to activate the appropriate transistor 304 as shown in FIG. 3, for example. The 'X' in each row indicates that the particular word line is currently selected and might be biased to a programming voltage, for example. Although Table 1 has been described with reference to a programming operation, Table 1 might also be representative of bias patterns stored and utilized during a read and/or erase operation as well.

TABLE 1

| Selected | WL Bias Pattern | | | |
|---|---|---|---|---|
| Word Line | WL0 | WL1 | WL2 | WL3 |
| WL0 | X | 8 V | 10 V | 10 V |
| WL1 | 8 V | X | 8 V | 10 V |
| WL2 | 7 V | 8 V | X | 10 V |
| WL3 | 0 V | 7 V | 8 V | X |

As discussed above, the bias patterns, such as those shown in Table 1, may be determined and corresponding bias information loaded into the register 314 by a test engineer during testing of the memory device, for example. This is in contrast to having to produce a new metal mask (e.g., new prototype device) each time the test engineer wishes to test a different word line biasing pattern as is needed in the prior art. Thus, various embodiments of the present disclosure facilitate the ability of a test engineer to test a particular bias pattern, then test a different bias pattern only by changing the bias pattern information loaded into the register 314, for example.

As discussed above, the register 314 might be loaded directly by a test engineer through interaction with a host device (e.g., processor) coupled to the memory device. A test engineer might also store one or more bias patterns in the memory array of the memory device itself. Upon initialization (e.g., boot up) of the memory device, the memory device control circuitry 316 might access the memory array locations storing the bias patterns and load a selection according to one of the patterns into the register 314, for example. According to still further embodiments, a host device coupled to the memory device might issue a particular command, to the memory device, such as during initialization and/or following a RESET, to load the register 314 with a selection according to one of the bias patterns stored in the memory array, for example. According to additional embodiments, the host might also provide the voltage selection to be loaded into the register 314 of the memory device, for example.

During operation of the memory device, such as during development testing of the memory device, the driver circuit 300 might be configured to operate in a test-mode according to various embodiments of the present disclosure. As part of a testing operation, the register 314 might be loaded with word line bias information by a user. The user can access the control circuitry 316 to indicate that the test mode of operation is desired. In response to the test mode indication made by the user, the control circuitry 316 can generate an appropriate SEL signal 310. This facilitates the register 314 contents loaded by the user to be passed through the multiplexer 308 and to the decoder 302. Following the transfer of bias information from the register 314 to the decoder 302, a memory device operation might be performed. A memory device operation might comprise one of a programming (e.g., write), read and/or erase operation, for example. The performance of the memory device under the current bias conditions, responsive to the voltage selection (according to the bias pattern) loaded by the user into the register 314 can then be evaluated. The loading of bias test patterns into the register 314 followed by performing one or more memory device operations can be repeated as many times as desired by the user.

Various embodiments according to the present disclosure are not limited to loading a single voltage selection into the test register 314. For example, a selection (corresponding to the bias pattern) corresponding to each word line might be loaded into the register 314. For example, for each word line there is an associated selection corresponding to the bias pattern loaded into the register 314. Thus, the selection of the voltage to utilize might be a function of which word line is selected for a particular memory device operation. According to one or more embodiments, each word line might have its own associated bias pattern. For example, a NAND string of memory cells comprising eight word lines, such as WL0-WL7 218 shown in FIG. 2, might have eight unique bias patterns, one unique bias pattern associated with the respective selection of each word line. For example, word line WL0 might have a particular word line bias pattern associated with selecting WL0. Word line WL1 might have a different word line bias pattern associated with selecting it, and so on. Each word line might have multiple associated voltage selections. A particular word line might have a programming bias selection and a different read bias selection associated with it. Additional embodiments might utilize a particular bias pattern that corresponds to more than one word line (e.g., global word line) selected for a memory device operation. For example, word lines WL3-WL5 of a memory device might utilize the same bias pattern when any of those word lines are selected, which might be a different bias pattern than those bias patterns associated with the selection of any of word lines WL0-WL2 and WL6-WL7, for example.

The PGM (program), READ and ERASE registers 318 shown in FIG. 3 might be loaded (e.g., programmed) with bias information previously determined utilizing the test mode of the memory device as discussed above. For example, a user may have generated one or more bias patterns for a number of memory device operating scenarios utilizing the test mode of the memory device. These generated patterns might then lead to bias information being programmed into their respective registers 318, according to various embodiments of the present disclosure. According to one or more embodiments, the registers 318 might comprise one or more types of non-volatile storage devices, such as read only memory (ROM) devices, for example. According to additional embodiments, a memory device might only use none, one or two of the registers 318 illustrated in FIG. 3, for example. For example, a memory device might only utilize the PGM $318_1$ and the READ $318_2$ registers in a user mode of operation, for example. A different memory device might only utilize the PGM register $318_1$ according to one or more embodiments of the present disclosure, for example.

FIG. 3 further illustrates additional circuitry according to various embodiments of the present disclosure. For example, if the test mode discussed above is not selected and instead a user mode is selected, the control circuitry 316 might generate the appropriate SEL 310 signal indicative of a user mode of the memory device. For example, as discussed above a logic high on the SEL signal line 310 might configure the multiplexer 308 to pass signals provided by the multiplexer 312 during the user mode of the memory device. Additional control signals 322 are provided to configure the multiplexer 312. These signals 322 might comprise signal lines which are biased to indicate a particular memory device operation to be performed. For example, if a program operation is to be performed in the user mode, the PGM signal of 322 might be a logic high and the READ and ERASE signals might be a logic low. The logic high on the PGM signal line of 322 configures the multiplexer 312 to pass bias information stored in the PGM register $318_1$ which then passes through multiplexer 308 and into decoder 302. Decoder 302 then enables the particular transistor 304 to bias the output node 342 during the current programming operation of a particular selected word line, for example.

The appropriate bias information to be output from the registers 318 during the current operation for a particular selected word line is determined by the WL DECODER 320. For example, the WL DECODER 320 might indicate first bias information is to be output from the READ register $318_2$ during a memory device read operation performed on a first selected word line. Different bias information might be indicated during a different memory device read operation performed on a second selected word line, and so on. Thus, the WL DECODER 320 can indicate to the three registers 318 which respective bias information to output based on the current word line selected for a particular memory device operation. The PGM, READ and ERASE signal lines 322 are then biased based on the current memory device operation to configure the multiplexer 312 to pass the appropriate bias information from the appropriate register 318.

Figure 4:
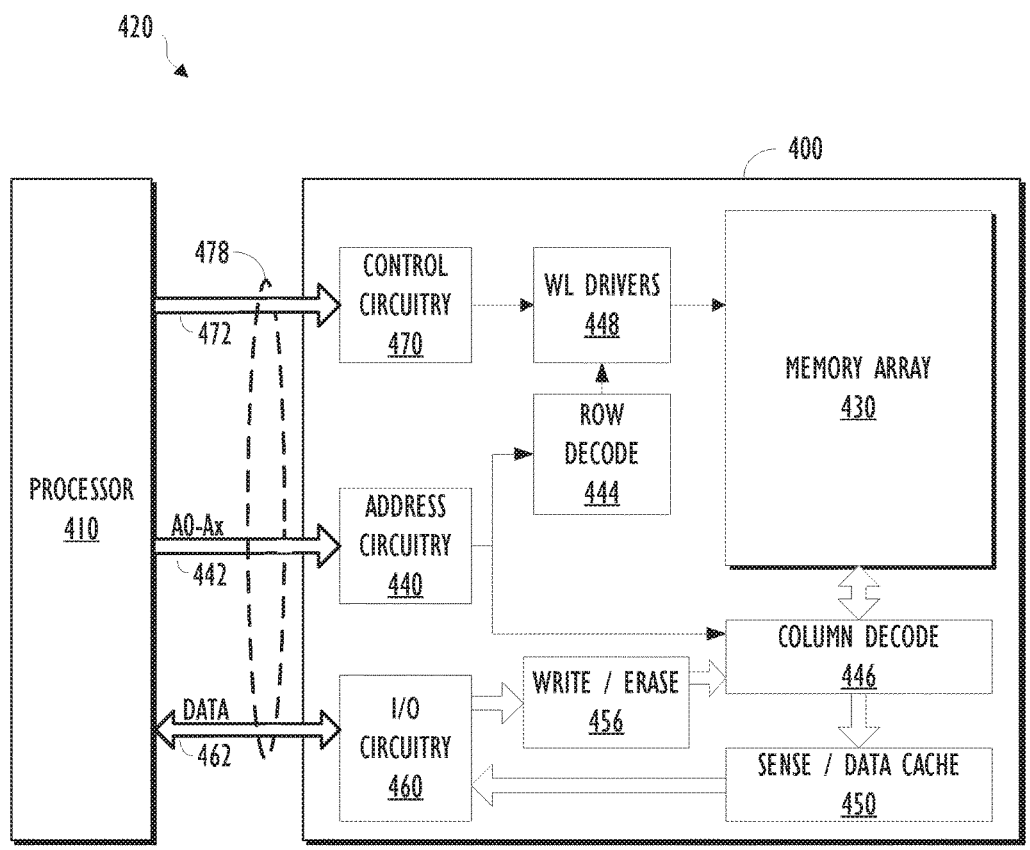
FIG. 4 shows a functional block diagram of an electronic system according to an embodiment of the present disclosure.

FIG. 4 is a functional block diagram of an electronic system having at least one memory device according to one or more embodiments of the present disclosure. The memory device 400 illustrated in FIG. 4 is coupled to a host such as a processor 410. The processor 410 may be a microprocessor or some other type of controlling circuitry. The memory device 400 and the processor 410 form part of an electronic system 420. The memory device 400 has been simplified to focus on features of the memory device that are helpful in understanding various embodiments of the present disclosure.

The memory device 400 includes one or more arrays of memory cells 430 that can be arranged in banks of rows and columns. Memory array 430 may comprise SLC and/or MLC memory, for example. According to one or more embodiments, the memory cells of memory array 430 are flash memory cells configured in a NAND architecture arrangement. The memory array 430 can consist of multiple banks, blocks and segments of memory cells residing on a single or multiple die as part of the memory device 400. The memory cells of the memory array 430 may also be adaptable to store varying densities (e.g., MLC(four level) and MLC(eight level)) of data in each cell, for example.

An address buffer circuit 440 is provided to latch address signals provided on address input connections A0-Ax 442. It will be appreciated by those skilled in the art, with the benefit of the present description, that the number of address input connections 442 depends on the density and architecture of the memory array 430. That is, the number of addresses increases with both increased memory cell counts and increased bank and block counts. Address signals are received and decoded by a row decoder 444 and a column decoder 446 to access the memory array 430. WL driver circuit 448 shown in FIG. 3 might comprise one or more of the word line driver circuits 300 shown in FIG. 3 and the word line driver circuits 202 shown in FIG. 2, for example. Row decode circuitry 444 might also comprise a portion or all of the WL decoder circuitry 320 shown in FIG. 3, according to various embodiments of the present disclosure.

The memory device 400 reads data in the memory array 430 by sensing voltage or current changes in the memory array columns using sense devices, such as sense/data cache circuitry 450. The sense/data cache circuitry 450, in at least one embodiment, is coupled to read and latch a row of data from the memory array 430. Data input and output buffer circuitry 460 is included for bi-directional data communication over a plurality of data connections 462 with the processor 410. Write/Erase circuitry 456 is provided to facilitate writing and erasing data in the memory array 430.

Control circuitry 470 is configured at least in part to implement the methods of various embodiments of the present disclosure, such as various word line biasing schemes, for example. The control circuitry 470 shown in FIG. 4 might comprise part of the control circuitry 316 discussed above with respect to FIG. 3, for example. In at least one embodiment, the control circuitry 470 may utilize a state machine. Control signals and commands can be sent by the processor 410 to the memory device 400 over the command bus 472. The command bus 472 may be a discrete signal or may be comprised of multiple signals, for example. These command signals 472 are used to control the operations on the memory array 430, including data read, data program (write), and erase operations. The command bus 472, address bus 442 and data bus 462 may all be combined or may be combined in part to form a number of standard interfaces 478. For example, the interface 478 between the memory device 400 and the processor 410 may be a Universal Serial Bus (USB) interface. The interface 478 may also be a standard interface used with many hard disk drives (HDD) as are known to those skilled in the art. For example, the interface may take the form of an SATA or PATA interface.

The electronic system illustrated in FIG. 4 has been simplified to facilitate a basic understanding of the features of the memory and is for purposes of illustration only. A more detailed understanding of internal circuitry and functions of non-volatile memories are known to those skilled in the art.

CONCLUSION

Various embodiments of the present disclosure provide apparatus and methods for access line biasing during operation of a memory device. One or more embodiments facilitate adjusting and utilizing one or more access line bias patterns during memory device operations without an associated hardware change.

Although specific embodiments have been illustrated and described herein, it will be appreciated by those of ordinary skill in the art that any arrangement that is calculated to achieve the same purpose may be substituted for the specific embodiments shown. Many adaptations of the disclosure will be apparent to those of ordinary skill in the art. Accordingly, this application is intended to cover any adaptations or variations of the disclosure.

What is claimed is:

1. A memory device, comprising:
an array of memory cells;
a plurality of access lines, each access line of the plurality of access lines selectively coupled to a respective plurality of memory cells of the array of memory cells;
a plurality of first registers, each first register of the plurality of first registers having an output;
a second register having an output;
a first multiplexer having an output and a plurality of inputs;
a second multiplexer having an output and a plurality of inputs; and
a decoder configured to selectively connect a corresponding access line of the plurality of access lines to a selected voltage source of a plurality of voltage sources in response to the output of the second multiplexer;
wherein the second multiplexer is configured to pass a selected one of the output of the second register and the output of the first multiplexer to its output; and
wherein the first multiplexer is configured to pass a selected one of the outputs of the plurality of first registers to its output.

2. The memory device of claim 1, wherein the decoder configured to selectively connect the corresponding access line of the plurality of access lines to a selected voltage source of the plurality of voltage sources in response to the output of the second multiplexer comprises a decoder having a plurality of outputs, wherein each output of the plurality of outputs of the decoder is connected to a control gate of a respective transistor connected between a respective voltage source of the plurality of voltage sources and the corresponding access line, and wherein the decoder is configured to enable one output of the plurality of outputs of the decoder in response to output signals of the output of the second multiplexer.

3. The memory device of claim 1, wherein the outputs of the plurality of first registers, the output of the second register, the output of the first multiplexer and the output of the second multiplexer each comprise a same number of signal lines.

4. The memory device of claim 3, wherein the plurality of voltage sources comprises a number of voltage sources equal to $2^N$, where N is equal to the number of signal lines.

5. The memory device of claim 1, wherein the plurality of access lines comprises a plurality of global access lines.

6. The memory device of claim 5, wherein the corresponding access line being selectively coupled to its respective plurality of memory cells of the array of memory cells comprises a corresponding global access line of the plurality of global access lines selectively connected to a local access line that is coupled to its respective plurality of memory cells.

7. The memory device of claim 6, wherein the corresponding global access line is selectively connected to more than one local access line.

8. A memory device, comprising:
an array of memory cells;
a plurality of access lines, each access line of the plurality of access lines selectively coupled to a respective plurality of memory cells of the array of memory cells;
a plurality of first registers, each first register of the plurality of first registers for storing a plurality of instances of access line bias information and having an output;
a second register for storing an instance of access line bias information and having an output;
a first multiplexer having an output and a plurality of inputs;
a second multiplexer having an output and a plurality of inputs; and
a decoder configured to selectively connect a corresponding access line of the plurality of access lines to a selected voltage source of a plurality of voltage sources in response to the output of the second multiplexer;
wherein each first register of the plurality of first registers is configured to pass a selected one of its plurality of instances of access line bias information to its output;
wherein the second register is configured to pass its instance of access line bias information to its output;
wherein the second multiplexer is configured to pass a selected one of the output of the second register and the output of the first multiplexer to its output; and
wherein the first multiplexer is configured to pass a selected one of the outputs of the plurality of first registers to its output.

9. The memory device of claim 8, further comprising:
control circuitry;
wherein the second multiplexer is configured to pass a selected one of the output of the second register and the output of the first multiplexer to its output responsive to a control signal from the control circuitry.

10. The memory device of claim 9, wherein the first multiplexer is configured to pass a selected one of the outputs of the plurality of first registers to its output responsive to control signals indicative of a memory device operation to be performed on the array of memory cells.

11. The memory device of claim 9, further comprising:
an access line decoder;
wherein each first register of the plurality of first registers is configured to pass a selected one of its plurality of instances of access line bias information to its output responsive to control signals from the access line decoder; and
wherein the access line decoder is configured to generate its control signals responsive to an indication from the control circuitry of a particular access line of the plurality of access lines being selected for a memory device operation.

12. The memory device of claim 8, wherein the decoder is a first decoder, the memory device further comprising:
a plurality of third registers, each third register of the plurality of third registers for storing a plurality of instances of access line bias information and having an output;
a fourth register for storing an instance of access line bias information and having an output;
a third multiplexer having an output and a plurality of inputs;
a fourth multiplexer having an output and a plurality of inputs; and
a second decoder configured to selectively connect a corresponding access line of the plurality of access lines to a selected voltage source of the plurality of voltage sources in response to the output of the fourth multiplexer;
wherein each third register of the plurality of third registers is configured to pass a selected one of its plurality of instances of access line bias information to its output;
wherein the fourth register is configured to pass its instance of access line bias information to its output;
wherein the fourth multiplexer is configured to pass a selected one of the output of the fourth register and the output of the third multiplexer to its output;
wherein the third multiplexer is configured to pass a selected one of the outputs of the plurality of third registers to its output; and
wherein the corresponding access line of the second decoder is a different access line of the plurality of access lines than the corresponding access line of the first decoder.

13. A memory device, comprising:
an array of memory cells;
a plurality of access lines, each access line of the plurality of access lines selectively coupled to a respective plurality of memory cells of the array of memory cells;
a plurality of first registers, each first register of the plurality of first registers for storing a plurality of instances of access line bias information for a respective memory device operation, and having an output;
a second register for storing an instance of access line bias information for a test mode operation of the memory device, and having an output;
a first multiplexer having an output and a plurality of inputs;
a second multiplexer having an output and a plurality of inputs; and
a decoder configured to selectively connect a corresponding access line of the plurality of access lines to a selected voltage source of a plurality of voltage sources in response to the output of the second multiplexer;
wherein each first register of the plurality of first registers is configured to pass a selected one of its plurality of instances of access line bias information to its output;
wherein the second register is configured to pass its instance of access line bias information to its output;
wherein the second multiplexer is configured to pass a selected one of the output of the second register and the output of the first multiplexer to its output; and
wherein the first multiplexer is configured to pass a selected one of the outputs of the plurality of first registers to its output.

14. The memory device of claim 13, wherein the respective memory device operation of a particular first register of the plurality of first registers is selected from a group consisting of a read operation, a write operation, and an erase operation.

15. The memory device of claim 13, further comprising:
a respective plurality of first registers for each access line of the plurality of access lines;
a respective second register for each access line of the plurality of access lines;
a respective first multiplexer for each access line of the plurality of access lines;
a respective second multiplexer for each access line of the plurality of access lines; and
a respective decoder for each access line of the plurality of access lines.

16. The memory device of claim 13, further comprising:
control circuitry;
wherein the second multiplexer is configured to pass a selected one of the output of the second register and the output of the first multiplexer to its output responsive to a control signal from the control circuitry indicative of whether or not to perform the test mode of operation on the array of memory cells.

17. The memory device of claim 16, wherein the first multiplexer, responsive to control signals indicative of which memory device operation is to be performed on the array of memory cells, is configured to pass the output of the first register of the plurality of first register corresponding to that memory device operation to its output.

18. The memory device of claim 13, further comprising:
a plurality of transistors;
wherein each transistor of the plurality of transistors is connected between a respective voltage source of the plurality of voltage sources and the corresponding access line;
wherein each transistor of the plurality of transistors has a respective control gate connected to a respective output of a plurality of outputs of the decoder; and
wherein the decoder is configured to enable one output of its plurality of outputs to activate its respective transistor of the plurality of transistors in response to output signals of the output of the second multiplexer.

19. The memory device of claim 13, wherein each instance of access line bias information comprises multiple digits of information for output from its respective first register or second register.

20. The memory device of claim 13, wherein the plurality of access lines comprises a plurality of global access lines, with each global access line of the plurality of global access lines selectively connected to a local access line of a respective subset of local access lines of a plurality of local access lines, and wherein each local access line of the plurality of local access lines is coupled to control gates of a respective plurality of memory cells of the array of memory cells.

* * * * *